(12) United States Patent
Hahn et al.

(10) Patent No.: US 10,217,586 B2
(45) Date of Patent: Feb. 26, 2019

(54) ELECTROMAGNETIC ACTUATOR

(71) Applicant: Siemens Aktiengesellschaft, Munich (DE)

(72) Inventors: Andreas Hahn, Cottbus (DE); Wolfgang Kuehn, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 275 days.

(21) Appl. No.: 15/035,499

(22) PCT Filed: Nov. 7, 2014

(86) PCT No.: PCT/EP2014/073995
§ 371 (c)(1),
(2) Date: May 10, 2016

(87) PCT Pub. No.: WO2015/082171
PCT Pub. Date: Jun. 11, 2015

(65) Prior Publication Data
US 2016/0293364 A1 Oct. 6, 2016

(30) Foreign Application Priority Data
Dec. 2, 2013 (DE) ........................ 10 2013 224 662

(51) Int. Cl.
*H01H 47/00* (2006.01)
*H01H 47/22* (2006.01)
(Continued)

(52) U.S. Cl.
CPC ........... *H01H 47/22* (2013.01); *G01R 33/072* (2013.01); *H01F 7/1844* (2013.01)

(58) Field of Classification Search
CPC ..................................................... H01H 47/22
See application file for complete search history.

(56) References Cited

U.S. PATENT DOCUMENTS 4,905,121 A  2/1990 Uetsuhara et al.
5,245,501 A  9/1993 Locher
(Continued)

FOREIGN PATENT DOCUMENTS

CN  86106547 A  4/1987
CN  102645850 A  8/2012
(Continued)

OTHER PUBLICATIONS

Korean Office Action and English translation thereof dated Sep. 1, 2017.
(Continued)

*Primary Examiner* — Stephen W Jackson
(74) *Attorney, Agent, or Firm* — Harness, Dickey & Pierce, P.L.C.

(57) ABSTRACT

The invention relates to a method for driving an electromagnetic actuator, which comprises a field winding for generating a magnetic field and a movable armature, wherein, in the method, in order to move the armature from a preset starting position into a preset end position, a magnetic flux is generated in the field winding and the magnetic flux through the field winding or a flux variable correlated with the magnetic flux through the field winding is measured so as to form an actual value. The invention provides that, in order to move the armature from the starting position into the end position, the magnetic flux through the field winding is regulated, namely in such a way that the characteristic of the actual value corresponds to a fixedly preset setpoint flux curve.

23 Claims, 4 Drawing Sheets

(51) Int. Cl.
*H01F 7/18* (2006.01)
*G01R 33/07* (2006.01)

(56) References Cited

U.S. PATENT DOCUMENTS

| | | | |
|---|---|---|---|
| 5,509,439 A | 4/1996 | Tantardini | |
| 5,892,649 A | 4/1999 | Kahr | |
| 6,208,497 B1 * | 3/2001 | Seale | F01L 9/04 361/154 |
| 6,476,599 B1 * | 11/2002 | Czimmek | F01L 9/04 123/90.11 |
| 7,898,788 B2 * | 3/2011 | Bataille | H01H 47/22 361/152 |
| 8,159,807 B2 | 4/2012 | Pohl | |
| 2002/0100439 A1 | 8/2002 | Rossi et al. | |
| 2004/0246649 A1 | 12/2004 | Besen | |
| 2007/0030618 A1 | 2/2007 | Heinz et al. | |
| 2010/0019581 A1 | 1/2010 | Pantke et al. | |
| 2012/0212723 A1 | 8/2012 | Hol et al. | |
| 2013/0214886 A1 | 8/2013 | Ohtsuka et al. | |
| 2014/0283793 A1 | 9/2014 | Tuerker et al. | |

FOREIGN PATENT DOCUMENTS

| | | |
|---|---|---|
| CN | 103262185 A | 8/2013 |
| DE | 19535211 A1 | 3/1997 |
| DE | 19544207 A1 | 6/1997 |
| DE | 10318244 A1 | 11/2004 |
| DE | 60103118 T2 | 4/2005 |
| DE | 102008040668 A1 | 1/2010 |
| DE | 102011075935 A1 | 11/2012 |
| DE | 102011086957 A1 | 5/2013 |
| EP | 0376493 A1 | 7/1990 |
| EP | 865660 A2 | 9/1998 |
| GB | 2310540 A | 8/1997 |
| JP | H02230702 A | 9/1990 |
| KR | 20060069823 A | 6/2006 |
| WO | WO 9007188 A1 | 6/1990 |
| WO | WO-9721237 A2 | 6/1997 |
| WO | WO-2007079767 A1 | 7/2007 |

OTHER PUBLICATIONS

Chinese Office Action dated Jan. 4, 2017.
Korean Office Action and English translation thereof dated Jan. 15, 2018.
International Search Report PCT/ISA/210 for International Application No. PCT/EP2014/073995 dated Feb. 9, 2015.
Written Opinion of the International Searching Authority PCT/ISA/237 for International Application No. PCT/EP2014/073995 dated Feb. 9, 2015.
European Office Action dated Aug. 27, 2018.

* cited by examiner

ELECTROMAGNETIC ACTUATOR

PRIORITY STATEMENT

This application is the national phase under 35 U.S.C. § 371 of PCT International Application No. PCT/EP2014/073995 which has an International filing date of Nov. 7, 2014, which designated the United States of America and which claims priority to German patent application number DE 102013224662.5 filed Dec. 2, 2013, the entire contents of which are hereby incorporated herein by reference.

FIELD

An embodiment of the present invention generally relates to a method for driving an electromagnetic actuator which comprises an exciter winding for generating a magnetic field and a movable armature. In an embodiment of the method, in order to move an armature from a predefined starting position into a predefined end position, a magnetic flux is generated in the exciter winding and the magnetic flux through the exciter winding, or a flux variable which correlates with the magnetic flux through the exciter winding, is measured by forming an actual value.

BACKGROUND

A method is known from German Laid-open patent application DE 195 44 207 A1. In the method known, in order to control the movement of the armature of the actuator during the armature movement, the movement variables, that is to say the acceleration, the speed and the respective location of the armature, are determined, specifically, inter alia, by evaluating the magnetic flux which flows through an exciter winding of the actuator. The current through the exciter winding is controlled with respect to compliance with a predefined movement sequence for the actuator by using the calculated movement variables.

SUMMARY

An embodiment of the invention is directed to a method. Advantageous refinements of the method according to embodiments of the invention are specified in claims.

According to at least one embodiment of the invention, in order to move the armature from the starting position into the end position, the magnetic flux through the exciter winding is regulated. In at least one embodiment, it is regulated in such a way that the profile of the actual value corresponds to a permanently predefined setpoint flux curve.

In at least one embodiment of the method, a determination or calculation of the movement parameters of the armature is intentionally dispensed with. Instead, according to at least one embodiment of the invention, the magnetic flux through the exciter winding is regulated on the basis of a permanently predefined setpoint flux curve. Therefore, in order to carry out at least one embodiment of the method according to the invention all that is necessary is to measure the actual value of the magnetic flux through the exciter winding, or a flux variable which correlates with the magnetic flux through the exciter winding, and to drive the exciter winding in such a way that a predefined setpoint flux curve is complied with. The actual movement behavior of the armature does not play a role in terms of the regulation according to at least one embodiment of the invention, with the result that the method can be carried out significantly more easily than, for example, the prior art method mentioned at the beginning.

At least one embodiment of the invention generally relates to an actuator having an exciter winding for generating a magnetic field, a movable armature, a sensor for measuring the magnetic flux through the exciter winding, or a flux variable which correlates with the magnetic flux through the exciter winding, by forming an actual value, and a control device for driving the exciter winding.

BRIEF DESCRIPTION OF THE DRAWINGS

The invention will be explained in more detail below with reference to example embodiments; here, by way of example.

For the sake of an overview, the same reference symbols are always used for identical or comparable components in the figures.

DETAILED DESCRIPTION OF THE EXAMPLE EMBODIMENTS

Figure 1:
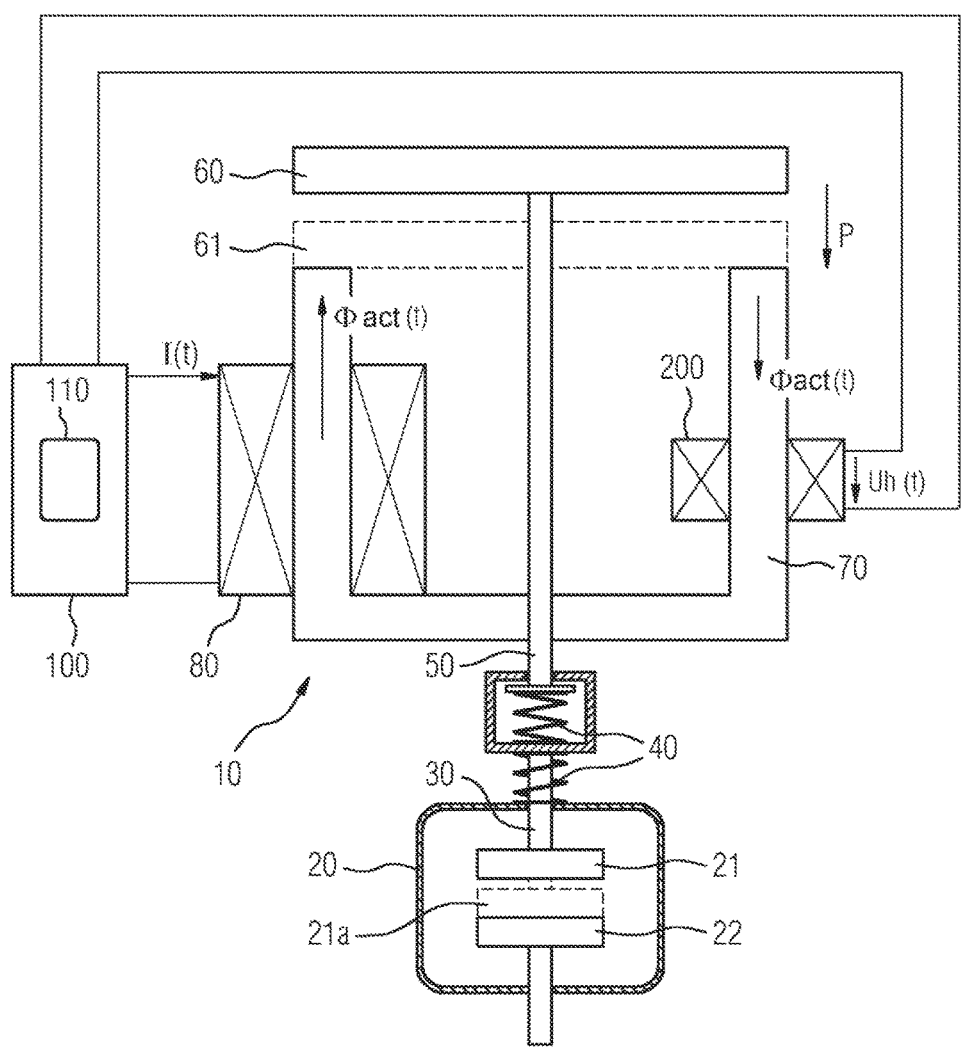
FIG. 1 shows an example embodiment of an arrangement having an actuator and an electrical switch which is connected to the actuator, wherein the actuator has an exciter winding, a control device and an auxiliary coil, connected to the control device, for measuring the magnetic flux.

According to at least one embodiment of the invention, in order to move the armature from the starting position into the end position, the magnetic flux through the exciter winding is regulated. In at least one embodiment, it is regulated in such a way that the profile of the actual value corresponds to a permanently predefined setpoint flux curve.

In at least one embodiment of the method, a determination or calculation of the movement parameters of the armature is intentionally dispensed with. Instead, according to at least one embodiment of the invention, the magnetic flux through the exciter winding is regulated on the basis of a permanently predefined setpoint flux curve. Therefore, in order to carry out at least one embodiment of the method according to the invention all that is necessary is to measure the actual value of the magnetic flux through the exciter winding, or a flux variable which correlates with the magnetic flux through the exciter winding, and to drive the exciter winding in such a way that a predefined setpoint flux curve is complied with. The actual movement behavior of the armature does not play a role in terms of the regulation according to at least one embodiment of the invention, with the result that the method can be carried out significantly more easily than, for example, the prior art method mentioned at the beginning.

With respect to the execution of the regulating process, it is considered advantageous if the voltage at the exciter winding and/or the current through the exciter winding is regulated within the scope of the regulation method in such a way that the actual value corresponds to the predefined setpoint flux curve.

In order to ensure defined acceleration of the armature, it is considered advantageous if the setpoint flux curve has a rise ramp section in which the setpoint flux curve rises from zero to a predefined ramp end value.

In order to ensure that after the armature has reached its end position it is held therein, it is considered advantageous if the setpoint flux curve has a holding section in which the setpoint flux curve has a constant holding value, wherein the holding value is dimensioned in such a way that the magnetic flux through the exciter coil can hold the armature in the end position.

The setpoint flux curve preferably has a rise ramp section, a holding section and at least one intermediate section located between them.

In order to bring about the most rapid possible movement of the armature into the end position, it is considered advantageous if the setpoint flux curve has, as an intermediate section or as at least one of the intermediate sections, an acceleration section in which the setpoint flux values are greater than in the holding section.

With a view to achieving minimum possible wear of the actuator it is considered advantageous if the armature is not too fast when it reaches the end position; accordingly, it is considered advantageous if the setpoint flux curve has, as an intermediate section or at least one of the intermediate sections, a braking section in which the setpoint flux values are lower than in the holding section.

With respect to the measurement of the actual value, it is considered advantageous if the magnetic flux through the exciter winding, or the flux variable which correlates with the magnetic flux through the exciter winding, is measured by means of a Hall sensor.

Alternatively or additionally it can be provided that the magnetic flux through the exciter winding, or the flux variable which correlates with the magnetic flux through the exciter winding, is measured by measuring the voltage at the exciter coil or the voltage at an auxiliary coil which is penetrated by the flux which also penetrates the exciter winding, or by a flux which is proportional thereto, by forming a coil voltage measured value, and by determining the actual value at least also by integration of the coil voltage measured value.

At least one embodiment of the invention generally relates to an actuator having an exciter winding for generating a magnetic field, a movable armature, a sensor for measuring the magnetic flux through the exciter winding, or a flux variable which correlates with the magnetic flux through the exciter winding, by forming an actual value, and a control device for driving the exciter winding.

With respect to such an actuator, at least one embodiment of the invention proposes that the control device is configured in such a way that it applies such a current to the exciter winding that the time profile of the actual value corresponds to a permanently predefined setpoint flux curve.

With respect to the advantages of the actuator according to at least one embodiment of the invention, reference is made to the statements above in respect of the method according to at least one embodiment of the invention.

It is considered particularly advantageous if the described actuator is used in an arrangement having an electrical switch, and serves to switch the electrical switch on or off. The invention therefore also relates to an arrangement having an electrical switch.

FIG. 1 shows an actuator in the form of an electromagnetic drive 10 for an electrical switch 20; the switch 20 can be, for example, an electrical power switch. The electrical switch 20 comprises a movable switching contact 21 and a fixed switching contact 22.

The movable switching contact 21 is connected to a drive rod 30 of the electromagnetic drive 10 which interacts with a spring device 40. Moreover, a further drive rod 50 is coupled to the spring device 40 and is connected to a movable armature 60 of the electromagnetic drive 10.

The armature 60 can carry out a reciprocating movement along a predefined sliding direction P and in the process can move in the direction of a yoke 70 of the drive 10. The FIG. 1 shows the armature 60 with unbroken lines in an open position (referred to below also as starting position) in which it is disconnected from the yoke 70. In the open position of the armature 60 there is the movable switching contact 21 in an open position, which is also illustrated with unbroken lines in FIG. 1. Dashed lines and the reference symbols 61 and 21a show the closed position (also referred to as end position below) of the armature 60, in which position said armature 60 rests on the magnetic yoke 70, and the closed position of the movable switching contact.

The function of the spring device 40 consists, inter alia, in making available a predefined contact pressure force in the closed state of the switch 20; in the example embodiment according to FIG. 1, the spring device 40 will press the further drive rod 50 in an upward direction in FIG. 1, with the result that the armature 60 is always subjected to a spring force which will move it into the open position, and which has to be compensated in the closed state by a correspondingly large holding force.

If the electrical switch 20 is to be closed with the electromagnetic drive 10, a current I(t) is fed into the exciter winding 80 by means of a control device 100, said current I(t) bringing about a magnetic flux within the exciter winding and moving the armature 60 into its closed position counter to the spring force of the spring device 40. The control device 100 preferably comprises a microprocessor or microcontroller 110 which regulates the current I(t), specifically in such a way that the profile of the respective value (actual value) Φact(t) of the magnetic flux corresponds to a permanently predefined setpoint flux curve Φsetp(t).

In order to permit this regulation of the magnetic flux, the control device 100 is connected to an auxiliary coil 200 which surrounds the magnetic yoke 70 and through which the same magnetic flux flows as through the exciter winding 80. The control device 100 or the microcontroller 110 thereof measures the electrical voltage Uh(t) dropping across the auxiliary coil 200, by forming a coil voltage measured value, and determines therewith the magnetic flux which penetrates the exciter winding 80 and the auxiliary coil 200 taking into account the induction law:

$$Uh(t)=N \cdot d\Phi act(t)/dt;$$

in the formula N denotes the number of windings of the auxiliary coil 200, Uh(t) denotes the voltage dropping across the auxiliary coil 200, Φact(t) denotes the actual value of the magnetic flux and t denotes the time.

The microcontroller 110 of the control device 100 controls the current I(t) through the exciter winding 80 taking into account the respective actual value Φact(t) of the magnetic flux, in such a way that the actual value Φact(t) of the magnetic flux in the chronological profile corresponds to a permanently predefined setpoint flux curve Φsetp(t). In other words, the regulation of the actuator movement or the regulation of the movement of the armature 60 takes place independently of the actual movement parameters thereof, but exclusively on the basis of the magnetic flux which penetrates the exciter winding 80 and the auxiliary coil 200.

Figure 2:
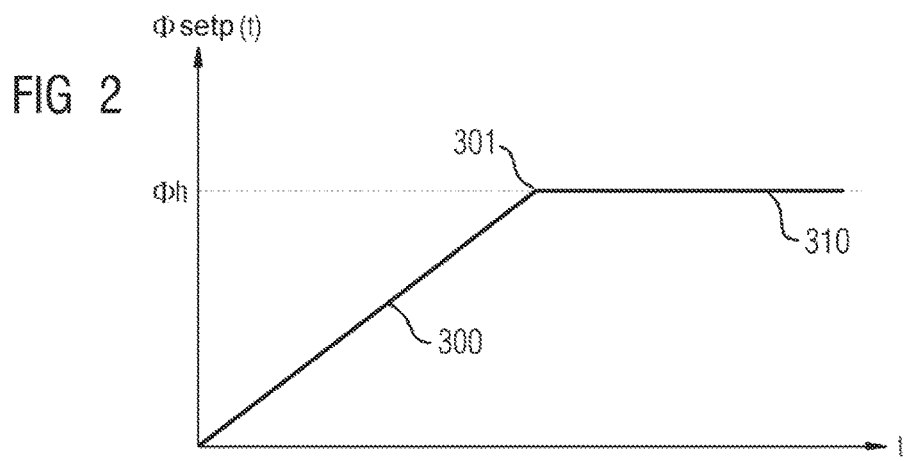
FIG. 2 shows a first example embodiment of a predefined setpoint flux curve, to which the control device according to FIG. 1 can regulate the magnetic flux.

FIG. 2 shows an example embodiment for a setpoint flux curve Φsetp(t) which the microcontroller 110 can use to drive the exciter winding 80 and to determine the coil current I(t). It is apparent that the setpoint flux curve Φsetp(t) according to FIG. 2 has a rise ramp section 300 in which the setpoint flux values rise from 0 to a predefined ramp end value 301, preferably linearly.

The rise ramp section 300 is adjoined by a holding section 310 in which the setpoint flux curve Φsetp(t) has a constant holding value Φh. The holding value Φh is dimensioned in such a way that the magnetic flux through the exciter coil 80 is sufficiently large to hold the movable armature 60 on the magnetic yoke 70 counter to the spring force of the spring device 40, and to hold the electrical switch 20 or the movable switching contact 21 thereof in the closed switch position.

In the case of the setpoint curve profile according to FIG. 2, the holding section 310 therefore ensures that the movable armature 60 can close the switch 20 and subsequently hold it in the closed position.

Figure 3:
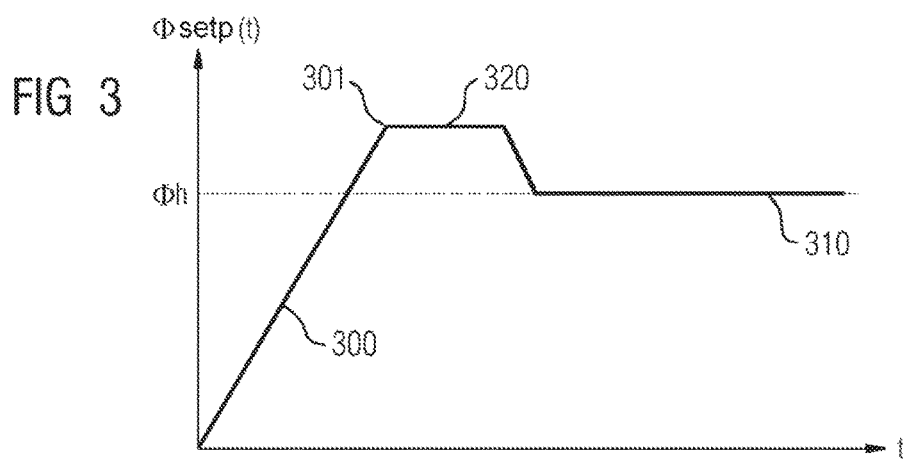
FIG. 3 shows a second example embodiment of a predefined setpoint flux curve on the basis of which the control device according to FIG. 1 can regulate the magnetic flux.

FIG. 3 shows a second example embodiment for a setpoint flux curve Φsetp(t) which can be used by the microcontroller 110 to drive the exciter winding 80 according to FIG. 1.

The setpoint flux curve Φsetp(t) has a rise ramp section 300 and a holding section 310, which sections can correspond to the rise ramp section 300 and the holding section 310 according to FIG. 2. In contrast to the example embodiment according to FIG. 2, in the case of the setpoint flux curve Φsetp(t) according to FIG. 3 between the rise ramp section 300 and the holding section 310 an acceleration section 320 is provided in which the setpoint flux values are given larger dimensions than in the holding section 310 and larger than the holding value Φh. The acceleration section 320 serves, in the initial phase of the acceleration of the movable armature 60, to bring about particularly large acceleration forces in order to increase the speed of the armature 60 in the initial phase particularly quickly. After the acceleration phase is concluded, the setpoint flux values of the setpoint flux curve are lowered again, specifically to the holding value Φh which is suitable for holding the armature 60 in the closed position. In other words, after the conclusion of the acceleration section 320, the setpoint flux values are lowered to the holding value Φh, giving rise to the holding section 320 in the form in which it has already been explained in relation to FIG. 2.

Figure 4:
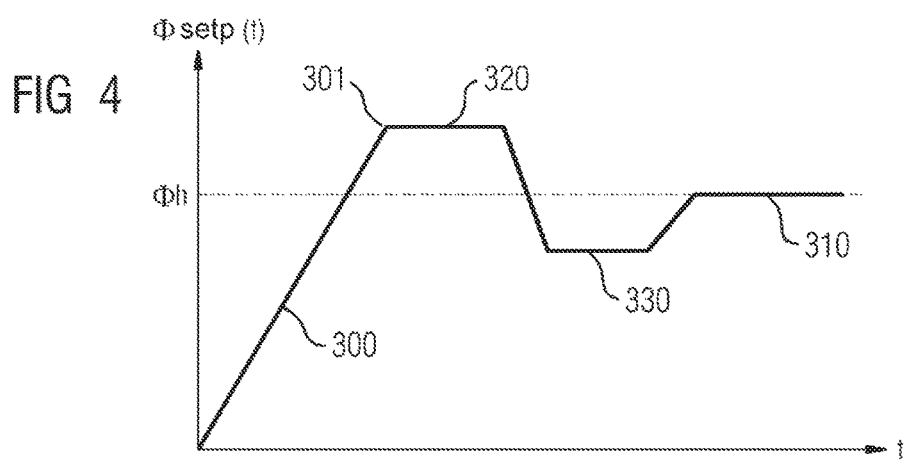
FIG. 4 shows a third example embodiment of a predefined setpoint flux curve with which the control device according to FIG. 1 can regulate the magnetic flux.

FIG. 4 shows an example embodiment for a setpoint flux curve Φsetp(t) in which, in addition to the rise ramp section 300, the acceleration section 320 and the holding section 310, a braking section 330 is provided. The braking section 330 is located chronologically between the acceleration section 320 and the holding section 310 and serves to allow the speed of the armature 60 to drop, before impacting against the magnetic yoke 70, to a value which ensures the minimum possible wear of the actuator parts of the actuator 10. In the braking section 330, the setpoint flux values of the setpoint flux curve Φsetp(t) are preferably lower than the holding value Φh with which the armature 60 can be held in its end position on the yoke 70. For this reason, the braking section 330 is adjoined by the holding section 310 by setting the holding value Φh with which permanent positioning of the armature 60 on the yoke 70 and secure holding of the closed position of the electrical switch 20 are ensured.

Figure 5:
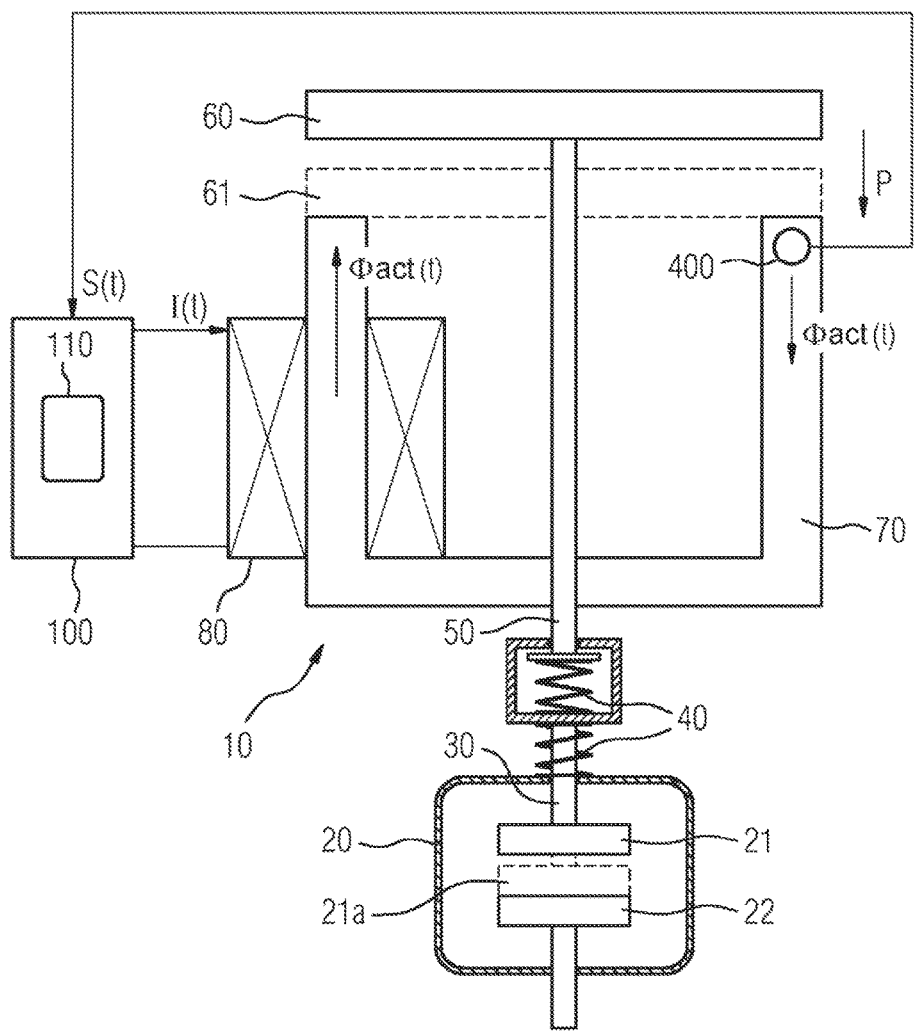
FIG. 5 shows an example embodiment of an arrangement having an actuator and an electrical switch, wherein the actuator has an exciter winding, a control device and a Hall sensor, connected to the control device, for measuring the magnetic flux.

FIG. 5 shows a second example embodiment for an actuator 10 and an electrical switch 20 in which a control device 100 of the actuator 10 causes the actual value Φact(t) of the magnetic flux through the yoke 70 and the assigned movable armature 60 to be regulated. The arrangement according to FIG. 5 corresponds, in terms of the design, essentially to the example embodiment according to FIG. 1 with the difference that no auxiliary coil is provided for measuring the actual value Φact(t) of the magnetic flux but instead a Hall sensor 400 which is connected to the control device 100 and the microcontroller 110. The Hall sensor 400 generates a measurement signal S(t) which is transmitted by the Hall sensor 400 to the control device 100 and the microcontroller 110. On the basis of the measurement signal S(t), the microcontroller 110 can determine the magnetic flux in the magnetic yoke 70 or the magnetic flux through the exciter winding 80 and set the current I(t) through the exciter winding 80 in such a way that the magnetic flux in the exciter winding 80 or in the magnetic yoke 70 corresponds in the time profile to a predefined setpoint flux curve Φsetp(t), such as has been shown above, for example in relation to FIGS. 2 to 4.

To summarize, the example embodiment according to FIG. 5 therefore differs from the example embodiment according to FIG. 1 merely in the detection of the actual value Φact(t) of the magnetic flux which flows through the exciter winding 80, the magnetic yoke 70 and the armature 60.

Figure 6:
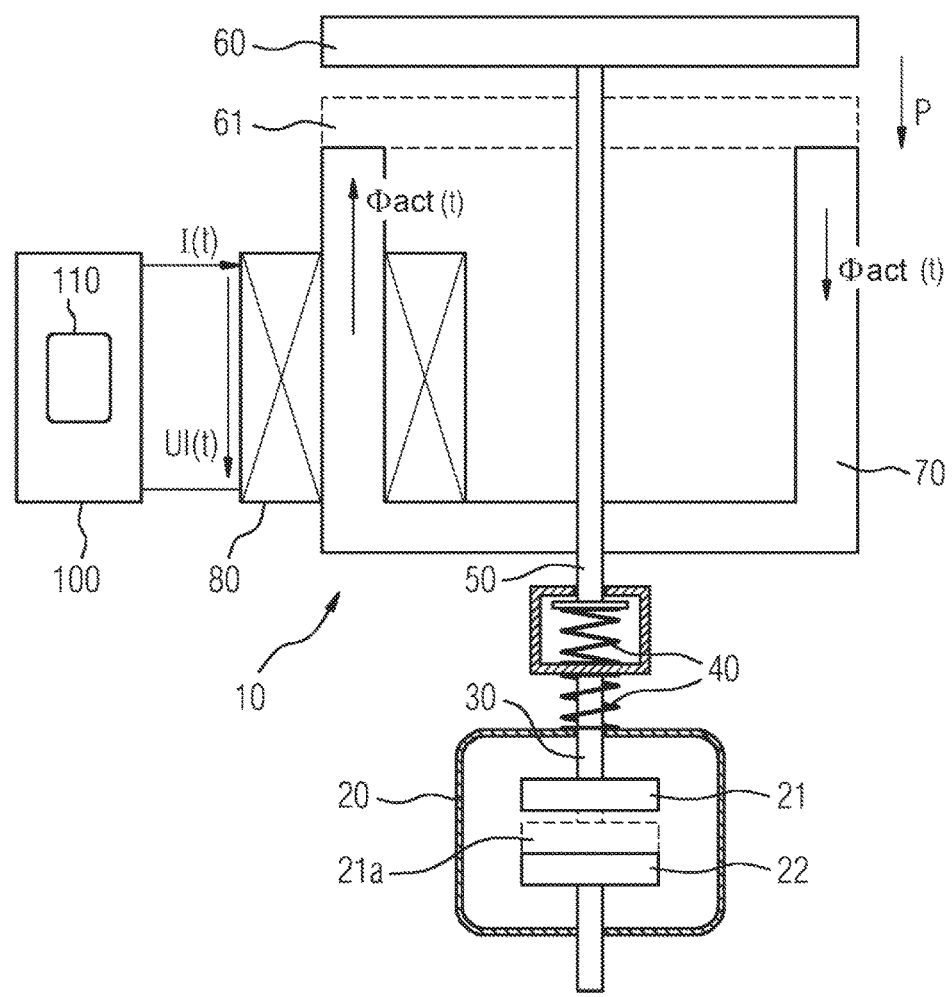
FIG. 6 shows an example embodiment of an arrangement having an actuator and an electrical switch, wherein the actuator has an exciter winding and a control device and uses the exciter winding to measure the magnetic flux.

FIG. 6 shows a further example embodiment for an arrangement having an armature 10 and an electrical switch 20. The arrangement according to FIG. 6 corresponds essentially to the arrangement according to FIGS. 1 and 5 with the difference that the control device 100 or the microcontroller 110 thereof does not have a separate sensor for measuring the magnetic flux in the exciter winding 80 or in the yoke 70, that is to say has neither an auxiliary coil 200 nor a Hall sensor 400. In order to measure the actual value Φact(t) of the magnetic flux in the exciter winding 80, the control device 100 or the microcontroller 110 thereof measures the voltage Ul(t) which drops across the exciter winding during the current flow I(t) through the exciter winding 80. By means of the corresponding coil voltage measured value, the microcontroller 110 can subsequently determine by integration the actual value Φact(t) of the magnetic flux, for example using the induction law, which has already been explained above.

The microcontroller 110 will subsequently regulate the current I(t), taking into account the actual values Φact(t) of the magnetic flux, in such a way that the actual value Φact(t) of the magnetic flux corresponds to a predefined setpoint flux curve, such as is shown, for example, in FIGS. 2 to 4.

Although the invention has been illustrated and described in more detail by means of preferred example embodiments, the invention is not restricted by the disclosed examples, and other variations can be derived therefrom by a person skilled in the art without departing from the scope of protection of the invention.

LIST OF REFERENCE SYMBOLS

10 Electromagnetic drive/actuator
20 Switch
21 Movable switching contact
21*a* Switching contact in closed position/end position
22 Fixed switching contact
30 Drive rod
40 Spring device 50 Further drive rod
60 Armature
61 Armature in closed position/end position
70 Yoke
80 Exciter winding
100 Control device
110 Microcontroller
200 Auxiliary coil
300 Rise ramp section
301 Ramp end value
310 Holding section
320 Acceleration section
330 Braking section
400 Hall sensor
I(t) Coil current
Φact(t) Magnetic flux
Φh Holding value
Φsetp(t) Setpoint flux curve
Φact(t) Actual value
P Sliding direction
S(t) Measurement signal
Uh(t) Voltage
Ul(t) Voltage

The invention claimed is:

1. A method for driving an electromagnetic actuator including an exciter winding for generating a magnetic field and a movable armature, the method comprising:
generating a magnetic flux in the exciter winding in order to move the armature from a starting position into an end position;
and
measuring the magnetic flux through the exciter winding, or a flux variable which correlates with the magnetic flux through the exciter winding, by forming an actual value, wherein, to move the armature from the starting position into the end position, the magnetic flux is regulated by the exciter winding, and wherein a profile of the actual value corresponds to a setpoint flux curve, the setpoint flux curve including a rise ramp section in which the setpoint flux curve rises from zero to a ramp end value.

2. The method of claim 1, wherein at least one of the voltage at the exciter winding and the current through the exciter winding is regulated by the method such that the actual value corresponds to the setpoint flux curve.

3. The method of claim 1, wherein the setpoint flux curve includes a holding section in which the setpoint flux curve has a constant holding value, and wherein the holding value is dimensioned such that the magnetic flux through the exciter winding is configured to hold the armature in the end position.

4. The method of claim 3, wherein the setpoint flux curve includes the rise ramp section, the holding section and at least one intermediate section located between the rise ramp section and the holding section.

5. The method of claim 4, wherein the setpoint flux curve includes, as the at least one intermediate section, an acceleration section in which the setpoint flux values are relatively greater than in the holding section.

6. The method of claim 4, wherein the setpoint flux curve includes, as the at least one intermediate section, a braking section in which the setpoint flux values are relatively lower than in the holding section.

7. The method of claim 1, wherein the magnetic flux through the exciter winding, or the flux variable which correlates with the magnetic flux through the exciter winding, is measured via a Hall sensor.

8. The method of claim 1, wherein the magnetic flux through the exciter winding, or the flux variable which correlates with the magnetic flux through the exciter winding, is measured by
measuring the voltage at the exciter winding or the voltage at an auxiliary coil penetrated by the flux, which also penetrates the exciter winding; or by a flux proportional thereto, by forming a coil voltage measured value, and
determining the actual value at least by integration of the coil voltage measured value.

9. An actuator comprising:
an exciter winding to generate a magnetic field;
a movable armature;
a sensor to measure magnetic flux through the exciter winding, or to measure a flux variable which correlates with the magnetic flux through the exciter winding, by forming an actual value; and
a control device to drive the exciter winding, the control device being configured to apply a current to the exciter winding, wherein a time profile of the actual value corresponds to a setpoint flux curve, the setpoint flux curve including a rise ramp section in which the setpoint flux curve rises from zero to a ramp end value.

10. An arrangement comprising:
the actuator of claim 9; and
an electrical switch, the actuator being configured to serve to move a movable contact of the electrical switch during at least one of switching on and off of the electrical switch.

11. The method of claim 2, wherein the setpoint flux curve includes a holding section in which the setpoint flux curve has a constant holding value, and wherein the holding value is dimensioned such that the magnetic flux through the exciter winding is configured to hold the armature in the end position.

12. The method of claim 11, wherein the setpoint flux curve includes the rise ramp section, the holding section and at least one intermediate section located between the rise ramp section and the holding section.

13. The method of claim 12, wherein the setpoint flux curve includes, as the at least one intermediate section, an acceleration section in which the setpoint flux values are relatively greater than in the holding section.

14. The method of claim 5, wherein the setpoint flux curve includes, as another of the at least one intermediate section, a braking section in which the setpoint flux values are relatively lower than in the holding section.

15. The method of claim 12, wherein the setpoint flux curve includes, as the at least one intermediate section, a braking section in which the setpoint flux values are relatively lower than in the holding section.

16. The method of claim 13, wherein the setpoint flux curve includes, as another of the at least one intermediate section, a braking section in which the setpoint flux values are relatively lower than in the holding section.

17. The arrangement of claim 10, wherein the setpoint flux curve includes a holding section in which the setpoint flux curve has a constant holding value, and wherein the holding value is dimensioned such that the magnetic flux through the exciter winding is configured to hold the armature in the end position.

18. The actuator of claim 9, wherein the setpoint flux curve includes a holding section in which the setpoint flux curve has a constant holding value, and wherein the holding value is dimensioned such that the magnetic flux through the exciter winding is configured to hold the armature in the end position.

19. The actuator of claim 18, wherein the setpoint flux curve includes the rise ramp section, the holding section and at least one intermediate section located between the rise ramp section and the holding section.

20. The actuator of claim 19, wherein the setpoint flux curve includes, as the at least one intermediate section, an acceleration section in which the setpoint flux values are relatively greater than in the holding section.

21. The actuator of claim 19, wherein the setpoint flux curve includes, as the at least one intermediate section, a braking section in which the setpoint flux values are relatively lower than in the holding section.

22. The actuator of claim 20, wherein the setpoint flux curve includes, as another of the at least one intermediate section, a braking section in which the setpoint flux values are relatively lower than in the holding section.

23. The arrangement of claim 17, wherein the setpoint flux curve includes the rise ramp section, the holding section and at least one intermediate section located between the rise ramp section and the holding section.

* * * * *